(12) United States Patent
Guyenot et al.

(10) Patent No.: US 9,887,173 B2
(45) Date of Patent: Feb. 6, 2018

(54) METHOD FOR PRODUCING STRUCTURED SINTERED CONNECTION LAYERS, AND SEMICONDUCTOR ELEMENT HAVING A STRUCTURED SINTERED CONNECTION LAYER

(75) Inventors: Michael Guyenot, Ludwigsburg (DE); Michael Guenther, Stuttgart (DE); Thomas Herboth, Ludwigsburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 588 days.

(21) Appl. No.: 14/130,362

(22) PCT Filed: Jun. 26, 2012

(86) PCT No.: PCT/EP2012/062304
§ 371 (c)(1),
(2), (4) Date: Mar. 26, 2014

(87) PCT Pub. No.: WO2013/004543
PCT Pub. Date: Jan. 10, 2013

(65) Prior Publication Data
US 2014/0225274 A1  Aug. 14, 2014

(30) Foreign Application Priority Data
Jul. 4, 2011 (DE) .................. 10 2011 078 582

(51) Int. Cl.
*H01L 23/00* (2006.01)
*H01L 23/373* (2006.01)

(52) U.S. Cl.
CPC ............. *H01L 24/64* (2013.01); *H01L 24/27* (2013.01); *H01L 24/29* (2013.01); *H01L 24/30* (2013.01);
(Continued)

(58) Field of Classification Search
CPC ......... H01L 24/27; H01L 24/29; H01L 24/30; H01L 24/32; H01L 24/64; H01L 24/70;
(Continued)

(56) References Cited

U.S. PATENT DOCUMENTS

2006/0068522 A1* 3/2006 Yoshimura .......... H01L 23/3737
438/108
2006/0192253 A1* 8/2006 Okumura .......... H01L 23/49827
257/378
(Continued)

FOREIGN PATENT DOCUMENTS

CN 101479839 A 7/2009
CN 101640974 A 2/2010
(Continued)

OTHER PUBLICATIONS

Eisele et al., "Pressure sintering for thermal stack assembly" International Exhibition & Conference for Power Elecctronics Intelligent Motion Power Quality, PCIM Europe 2007, 360-5.*
(Continued)

*Primary Examiner* — Bo Fan
(74) *Attorney, Agent, or Firm* — Norton Rose Fulbright US LLP; Gerard Messina

(57) ABSTRACT

A method for producing a sinter layer connection between a substrate and a chip resulting in an electric and thermal connection therebetween and in reduced mechanical tensions within the chip. The method produces a sinter layer by applying a multitude of sinter elements of a base material forming the sinter layer in structured manner on a contact area of a main surface of a substrate; placing a chip to be joined to the substrate on the sinter elements; and heating and compressing the sinter elements to produce a structured sinter layer connecting the substrate and chip and extending within the contact area, the surface coverage density of the sinter elements on the substrate in a center region of the
(Continued)

contact area being greater than the surface coverage density of the sinter elements in an edge region of the contact area, and at least one through channel, extending laterally as to the substrate's main surface being provided towards the contact area's edge. A large-area sinter element is situated in the contact area's center region, and circular sinter elements is situated in a contact area edge region. The sinter elements may also have notches. Also described is a related device.

16 Claims, 3 Drawing Sheets

(52) U.S. Cl.
CPC ............... *H01L 24/70* (2013.01); *H01L 24/83* (2013.01); *H01L 23/3735* (2013.01); *H01L 24/32* (2013.01); *H01L 2224/2732* (2013.01); *H01L 2224/27418* (2013.01); *H01L 2224/27848* (2013.01); *H01L 2224/29* (2013.01); *H01L 2224/29007* (2013.01); *H01L 2224/29012* (2013.01); *H01L 2224/29015* (2013.01); *H01L 2224/29023* (2013.01); *H01L 2224/29036* (2013.01); *H01L 2224/29139* (2013.01); *H01L 2224/29298* (2013.01); *H01L 2224/3003* (2013.01); *H01L 2224/3012* (2013.01); *H01L 2224/3016* (2013.01); *H01L 2224/30051* (2013.01); *H01L 2224/30142* (2013.01); *H01L 2224/30181* (2013.01); *H01L 2224/32014* (2013.01); *H01L 2224/73103* (2013.01); *H01L 2224/73203* (2013.01); *H01L 2224/83048* (2013.01); *H01L 2224/8384* (2013.01); *H01L 2224/83203* (2013.01); *H01L 2924/00011* (2013.01); *H01L 2924/00013* (2013.01); *H01L 2924/01005* (2013.01); *H01L 2924/01029* (2013.01); *H01L 2924/01047* (2013.01); *H01L 2924/07811* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01); *H01L 2924/1517* (2013.01); *H01L 2924/15747* (2013.01); *H01L 2924/15787* (2013.01); *H01L 2924/3512* (2013.01)

(58) Field of Classification Search
CPC ... H01L 2224/2732; H01L 2224/27418; H01L 23/3737; H01L 23/492; H01L 23/49827; H01L 23/3735
USPC ........ 257/705, 706, 774, 378; 438/107, 108; 361/321.1
See application file for complete search history.

(56) References Cited

U.S. PATENT DOCUMENTS

| 2010/0093131 A1* | 4/2010 | Maeda ................ B23K 1/0016 438/107 |
| 2013/0094122 A1* | 4/2013 | Domes ................ H05K 7/1432 361/321.1 |

FOREIGN PATENT DOCUMENTS

| DE | 10 2006 009021 | 8/2006 | |
| EP | 1 450 402 | 8/2004 | |
| EP | 2 075 835 | 7/2009 | |
| EP | 2075835 A2 * | 7/2009 | ........... H01L 23/492 |
| JP | 6-302628 | 10/1994 | |
| JP | 2004-253703 | 9/2004 | |
| JP | 2006-237429 | 9/2006 | |
| JP | 2008-10703 | 1/2008 | |
| JP | 2009-54893 | 3/2009 | |
| JP | 2011-71301 | 4/2011 | |

OTHER PUBLICATIONS

"Low-Temperature Connection Technology of Power ELectronics", (Fortschritt Reports of the VDI, series 21, No. 365, VDI-Verlag).

\* cited by examiner

METHOD FOR PRODUCING STRUCTURED SINTERED CONNECTION LAYERS, AND SEMICONDUCTOR ELEMENT HAVING A STRUCTURED SINTERED CONNECTION LAYER

FIELD OF THE INVENTION

The present invention relates to a method for producing structured sintered layers and to a semiconductor component, especially a power electronics component, having a structured sintered layer.

BACKGROUND INFORMATION

Electronic components such as power diodes, (vertical) power transistors or other components must be mounted on substrates. Because of the high currents through such components, it is important to ensure excellent electric and thermal coupling between the components and the substrate.

It is possible to use sintered connections on silver basis (silver sintering) for the mechanical connection between semiconductors and metallic layers, e.g., copper layers, such as the Low-Temperature Connection Technology of Power Electronics (Fortschritt Reports of the VDI, series 21, No. 365, VDI-Verlag), and related methods. In silver sintering, a paste including micro particles or nano particles is compressed under increased temperature and increased pressure; during this process the individual particles coalesce to form a mechanically stable sinter layer and establish a stable mechanical connection between two components abutting the sinter layer.

Because of the different coefficients of thermal expansion of semiconductors and metallic layers, mechanical warping may occur in the sinter layer, which could have an adverse effect on the stability and reliability of the sinter layer.

The printed publication EP 2 075 835 A2 discusses methods for developing sinter layers between a semiconductor chip and a substrate, which can be used to improve the mechanical stability in that the sinter layer is set apart from the edges of the semiconductor chip and interspaces are developed between individual sinter sections.

SUMMARY OF THE INVENTION

In one specific embodiment, the present invention provides a method for producing a sinter layer; the method includes the steps of applying a multitude of sinter elements from a base material forming the sinter layer in structured manner on a contact area of a main surface of a substrate; placing a chip to be bonded to the substrate on the sinter elements; and heating and compressing the sinter elements in order to produce a structured sinter layer that connects the substrate and the chip and extends within the contact area, the surface coverage density of the sinter elements on the substrate in a center region of the contact area being greater than the surface coverage density of the sinter elements in an edge region of the contact surface; furthermore, at least one through channel, which extends laterally with respect to the main surface of the substrate, is provided from each sintered element towards the edge of the contact surface.

According to another specific embodiment, the present invention provides a semiconductor component, especially a power electronics semiconductor component, having a substrate with a main surface, a semiconductor chip disposed on the main surface of the substrate, and a structured sinter layer, which is situated between the substrate and the semiconductor chip on a contact area of the main surface and connects the chip to the substrate; the sinter layer includes a multitude of sinter elements whose surface coverage density on the substrate in a center region of the contact area is greater than the surface coverage density of the sinter elements in an edge region of the contact area; furthermore, at least one through channel, which extends laterally to the main surface of the substrate, is provided between the substrate and the chip toward the edge of the contact area.

One basic aspect of the present invention is the production of a sinter layer connection between a substrate and a chip which produces a satisfactory electric and thermal connection between the substrate and the chip and also reduces mechanical tensions within the chip. This is achieved by a sinter layer made up of a multitude of sinter elements, which are placed in structured manner between the substrate and chip produced from a contact area. Because of a higher surface coverage density of the sinter elements in the center of the contact area it is possible to ensure excellent thermal and electrical conductivity in the particular locations where high temperatures typically develop when the chip is in operation. The surface coverage density of the sinter elements at the edge of the contact area is lower than in the center, so that the compression pressure there on each sinter element during the sintering process is effectively higher than in the center, which enhances the reliability of the sinter connection in the edge region.

A through channel to each sinter element is formed along the main surface of the substrate between chip and substrate, so that gassing and degassing is ensured for all sinter elements during the sintering process. In particular the oxygen supply, which is required for adequate sintering, is able to be ensured via the through channels for each sinter element. At the same time, the gases emitted by the sinter elements during the sintering process are able to be discharged via the through channels, so that a uniform and predictable development of the sinter layer in all regions of the contact area is advantageously possible.

In an advantageous manner, many sinter elements are able to be formed in the edge region, in particular, so that the entire thermal or electrical conductivity of the sinter layer will not be adversely affected even if individual sinter connections fail during or after the sintering operation, i.e., if there is a lack in thermal or electrical conductivity across individual sinter elements, because other sinter elements in the edge region are able to assume the function of the malfunctioning sinter elements.

It may be advantageous to gradually increase the surface coverage density of the sinter elements on the substrate in a region of the contact area between the center region and edge region, from the surface coverage density in the edge region toward the surface coverage density in the center region of the contact area.

The edge of the contact area in the lateral direction along the main surface of the substrate may advantageously be set apart from the edges of the chip by a predefined length. This may advantageously reduce mechanical stressing of the fracture-prone chip edge.

In addition, it may be advantageous to select a larger lateral extension of the sinter elements in the center region of the contact area, in comparison with the lateral extension of the sinter elements in the edge region of the contact area. For one, this achieves a high surface coverage density in the mechanically less stressed center region of the contact area, which therefore results in improved thermal and electrical contacting of the sinter layer with the chip. For another, because of the lower surface coverage density in the edge region, the effective sinter pressure on each of the smaller sinter elements is increased in the edge region, which means that there is greater reliability of the sintering process and of the stability of the sinter connection in the mechanically heavily stressed edge region of the contact area.

Advantageous developments constitute the subject matter of the respective further descriptions herein.

The above embodiments and developments may be combined as desired if such a combination appears useful. Additional possible embodiments, developments and implementations of the present invention also include combinations of features of the present invention not explicitly mentioned above or below with regard to the exemplary embodiments.

Further features and advantages of specific embodiments of the present invention result from the following description with reference to the enclosed drawings.

DETAILED DESCRIPTION

Unless stated otherwise, identical or functionally equivalent elements, features and components have been provided with the same reference symbols. It is understood that components and elements in the figures are not necessarily depicted true to scale with respect to one another for reasons of clarity and comprehensibility.

Figure 1A:
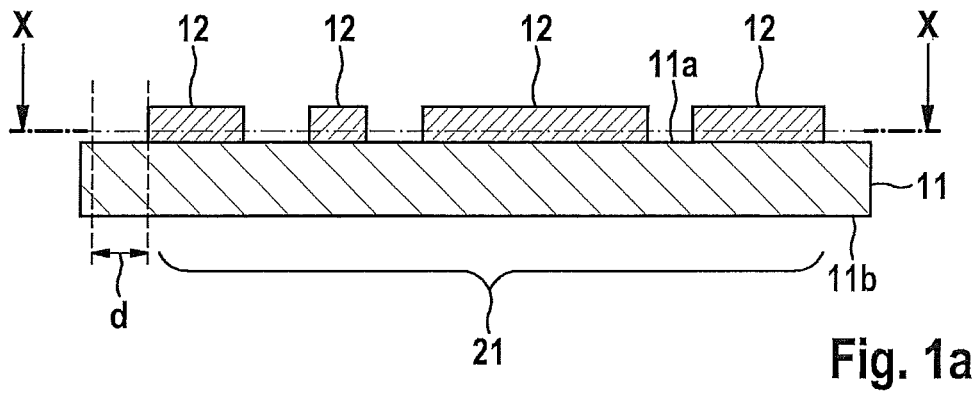
FIG. 1a to 1c show schematic representations of the stages of a method for producing a structured sinter layer on a substrate according to one specific embodiment of the present invention.
Figure 1B:
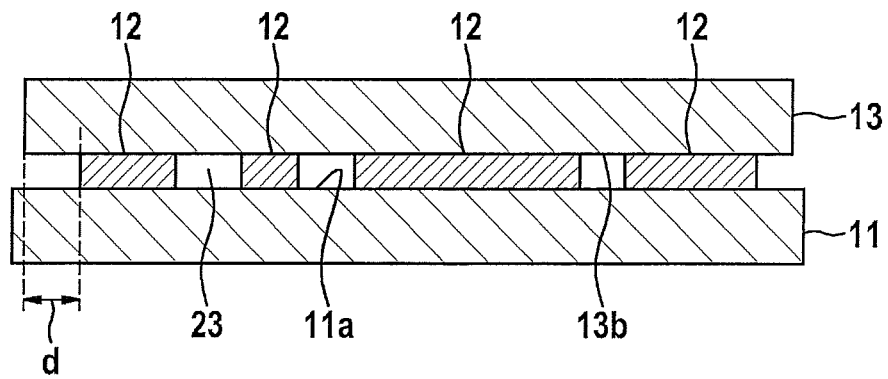
Figure 1C:
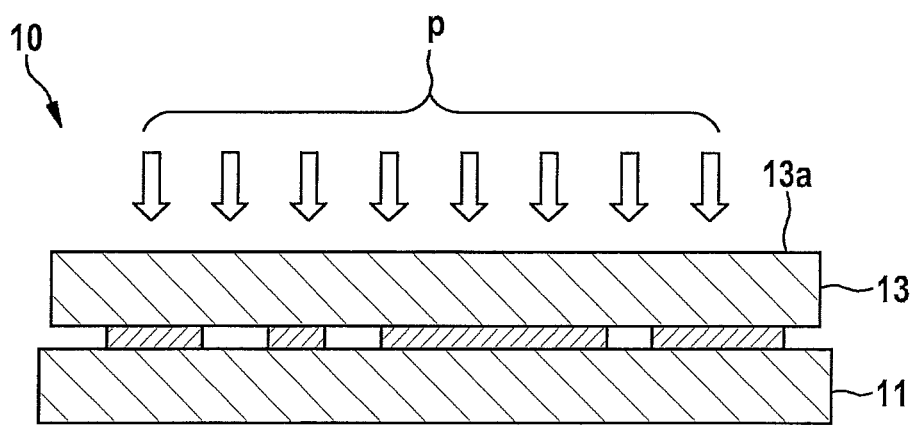

FIGS. 1a through 1c show stages of a method for producing structured sinter layers 12 on a substrate 11. FIG. 1a shows a schematic representation of a substrate 11 having a first main surface 11a and a main surface 11b which lies opposite first main surface 11a. For example, substrate 11 may be a metal substrate, especially a copper substrate, or a substrate coated with metal. A noble metal surface, e.g., because of a nickel-gold metal coating on a copper substrate, is able to ensure excellent adhesion of the sinter layer on the substrate. Sinter elements for the development of a sinter layer 12 may be applied on main surface 11a. For example, the sinter elements may be deposited in structured form, i.e., regions on main surface 11a of substrate 11 may be covered by a material that forms sinter layer 12, e.g., a sinter paste, whereas other regions are not covered by the material. By way of example, four regions of sinter layer 12 which are interrupted by regions left free are shown in FIG. 1a.

Sinter layer 12 may be made up of a multitude of sinter elements, which are applied within a contact area 21 on main surface 11a of substrate 11. The sinter elements may be applied in structured form, for example using a screen-printing technique, a stencil printing method, mask printing method, an ink printing method, a spray method or similar structuring techniques. The sinter elements are able to be produced from a base material for sinter layer 12 such as a sinter paste with silver micro particles. In addition to solvents, the sinter paste may include one or more heat-treatment-volatile components, especially a stabilizing agent. The component may be a wax, especially a ground wax, which may be stearic acid. During the thermal treatment that initiates the sinter process, the component is at least partially expelled, which makes it possible for the silver particles to cluster together.

Sinter layer 12 may be produced with a sinter layer thickness (to be distinguished from the printing layer thickness) of between 5 µm and 100 µm, especially between 15 µm and 100 µm, especially at approximately 25 µm. Prior to the actual sintering process, the sinter elements of sinter layer 12 may be dried using a drying method, so that the material that is encompassed by the sinter elements is largely free of solvents, to ensure that a certain compressive strength is obtained and the later degassing of the solvent during the actual sintering process is able to be avoided or reduced.

FIG. 1b shows a schematic representation of a second stage of the method. A chip 13, e.g., a semiconductor chip, is placed on the sinter elements using a main surface 13. For example, chip 13 may include a power transistor, a power diode or some other power component. Chip 13 may include a MOSFET, an IGBT, JFET, BJT, a switchable thyristor or a similar component. Chip 13 may have a surface 13b, whose lateral extension is greater than the lateral extension of contact area 21. In particular, a predefined distance d may separate contact area 21 and the side edge of chip 13. Distance d may extend around contact area 21 and establish a so-called "underprint", that is to say, an incomplete connection of the entire surface 13b of chip 13 across sinter layer 12. This can advantageously reduce the stress on the fracture-prone chip edges.

Through channels 23 can be formed between the sinter elements. Through channels 23 may extend between substrate 11 and chip 13 in lateral manner with respect to main surface 11a of substrate 11. More specifically, each sinter element may be connected to the edge of the contact area via a through channel 23. Through channels 23 are able to route process gases to and from the sinter elements during the sintering process. For example, oxygen may be routed to the sinter elements by way of the through channels, so that sufficient sintering of the sinter paste is able to take place. It may also be the case that gases that escape from the sinter material during the sintering of the sinter elements are discharged from the semiconductor component via through channels 23. In the absence of such through channels 23, these gases may escape from the semiconductor component in uncontrolled manner and thereby form non-reproducible degassing channels that could adversely affect the characteristics of sinter layer 12.

Figure 2:
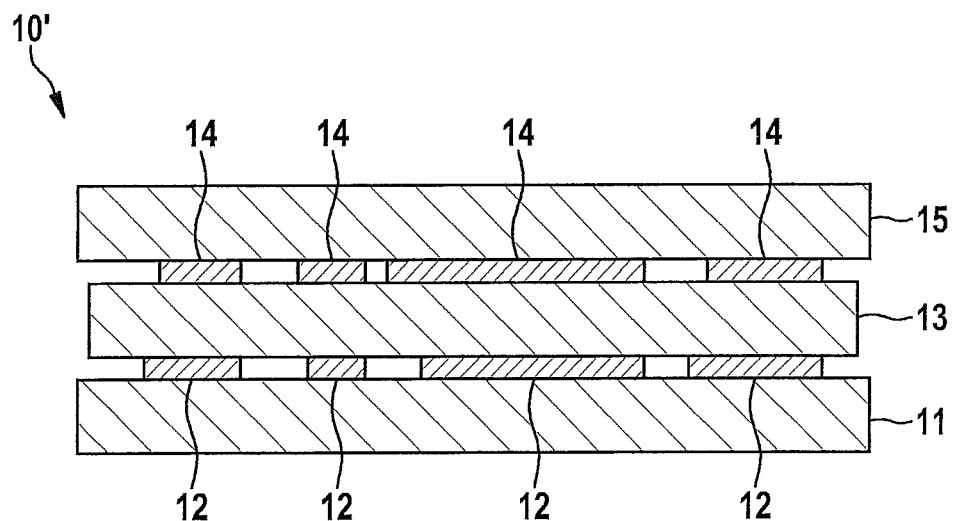
FIG. 2 shows a schematic representation of a component having structured sinter layers according to another specific embodiment of the present invention.

In a third stage of the method, shown in FIG. 1c, sinter layer 12 may be formed by heating to a predefined sinter temperature between 200° C. and 400° C. according to a specified temperature profile and by compressing chip 13 and substrate 11 according to a specified pressure profile. A pressure p of less than 30 MPa, especially less than 10 MPa, may be exerted on chip 13 or substrate 11 for this purpose, perpendicular to main surface 11a of the substrate, as schematically shown by the arrows in FIG. 1c. The compression makes it possible to reduce the thickness of the sinter elements. In this way a semiconductor component 10 is able to be produced which has a substrate 11, a semiconductor chip 13, and a sinter layer 12 connecting substrate 11 and chip 13. FIG. 2 shows a schematic representation of a component 10' having structured sinter layers 12, 14. Component 10' differs from component 10 in FIG. 1c insofar as chip 13 is connected to a substrate 11 and 15 on both main surfaces provided with sinter layers 12 and 14. Substrate 15 may be similar to substrate 11.

Figure 3:
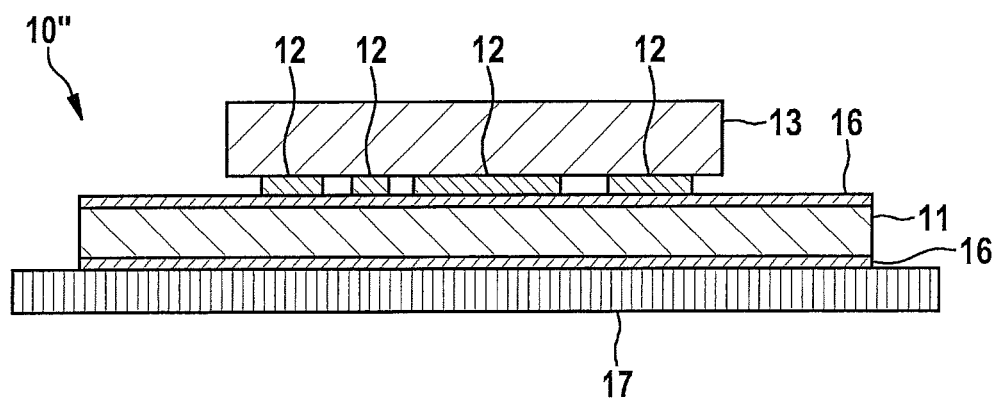
FIG. 3 shows a schematic representation of a component having structured sinter layers according to another specific embodiment of the present invention.

FIG. 3 shows a schematic representation of a component 10" having a structured sinter layer 12. Component 10" differs from component 10 in FIG. 1c insofar as chip 13 is a vertical power MOSFET or power IGBT, which is connected to a substrate 11 via a sinter layer 12. Substrate 11 may be a DBC substrate (directly bonded copper), which, for example, includes ceramics having a low coefficient of thermal expansion, and which is provided with a copper layer 16 at its two main surfaces. It may also be the case that the substrate includes an IMS (insulated metal substrate), PCB (printed circuit board) substrate, AMB (active metal brazing) substrate, or a ceramic one-layer or multi-layer substrate. Substrate 11 may be situated on a heat sink 17 made completely of metal, such as copper, via which the heat produced in the power MOSFET is able to dissipated.

Figure 4:
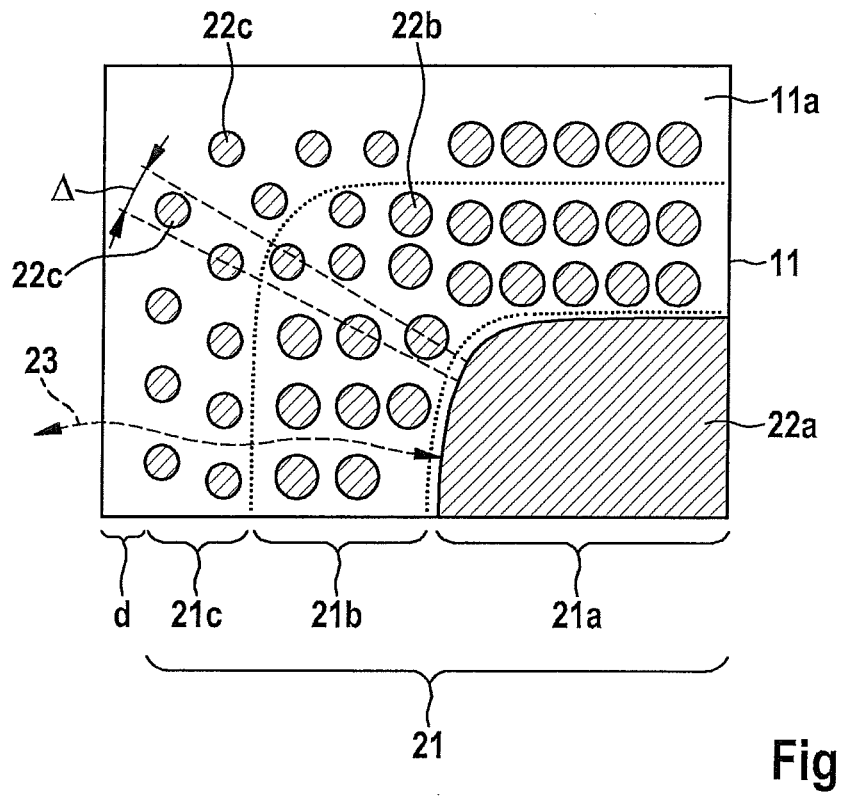
FIG. 4 shows a schematic representation of the surface structuring of a component having a sinter layer according to another specific embodiment of the present invention.
Figure 5:
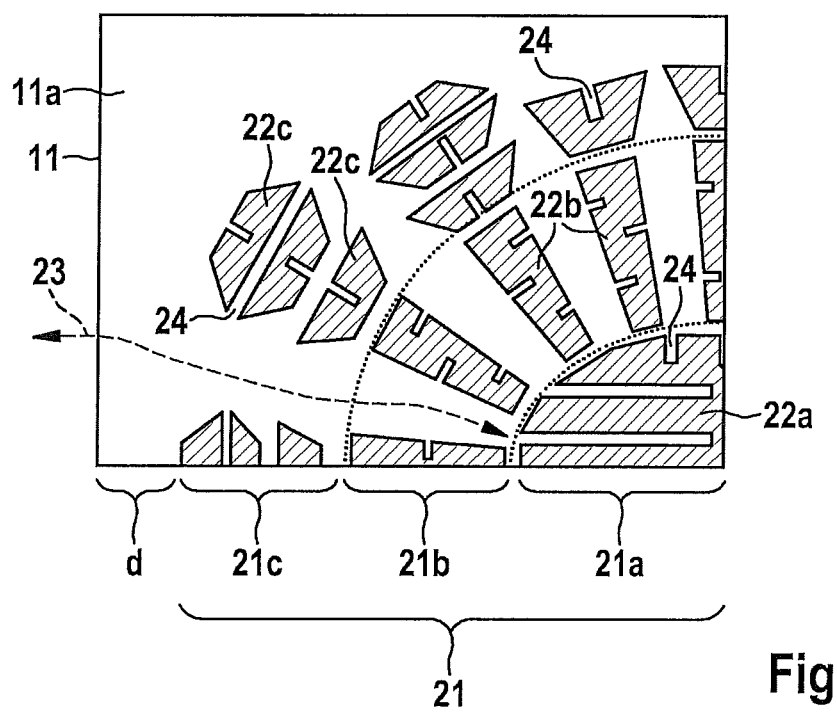
FIG. 5 shows a schematic representation of the surface structuring of a component having a sinter layer according to another specific embodiment of the present invention.

FIGS. 4 and 5 show exemplary specific embodiments of the structuring of sinter layer 12 using different forms and distributions of sinter elements 22a, 22b, 22c. The representations shown in FIGS. 4 and 5 are sectional views along sectional line x-x shown in FIG. 1a.

FIGS. 4 and 5 show a substrate 11 with a main surface 11a pointing out of the drawing plane; a contact area 21, within which a multitude of sinter elements 22a, 22b, 22c have been formed, is developed on main surface 11a. The edges of the contact area, i.e., the sinter elements 22 that are outermost in relation to the center of the contact area, are advantageously set apart from the edge of substrate 11 by a predefined distance d.

The illustrations in FIGS. 4 and 4 each show a quarter of substrate 11, the lower right corner being situated in the center of substrate 11 in each case. In other words, substrate 11 may be subdivided into four quarters, and each of these quarters may be provided with a corresponding, mirror-image array of sinter elements 22a, 22b, 22c. This results in a substrate 11 having a contact area 21 which has a center region 21a lying in the center of substrate 11, an edge region 21c lying at the edge of contact area 21, and an intermediate region 21b lying between center region 21a and edge region 21c. The boundaries of regions 21a, 21b and 21c of contact area 21 are sketched by corresponding boundary lines in FIGS. 4 and 5.

In the exemplary embodiment shown in FIG. 4, a large-area sinter element 22a is situated in center region 21a. For example, center region 21a may occupy at least 10%, especially more than 20%, of the contact area. Sinter element 22a ensures excellent thermal and/or electrical contacting between substrate 11 and chip 13 in the center region. The surface coverage density in center region 21a, i.e., the portion per area unit of main surface 11a covered by sinter elements, consequently is very high.

In an edge region 21c, on the other hand, a multitude of sinter elements 22c are located, which could be circular in shape, for example. The lateral extension of sinter elements 22c, such as their diameter, for instance, is much smaller than the lateral extension of sinter element 22a. On the other hand, the number of sinter elements 22c is considerably higher than the number of sinter elements 22a in center region 21a. The surface coverage density in edge region 21c is smaller than the surface coverage density in center region 21a. For one, this makes it possible for the pressure that is exerted on the individual sinter elements 22c during the sintering process to be higher in edge region 21c than the pressure exerted on sinter elements 22a in the center region. This leads to higher mechanical stability of the sinter bond in edge region 21c than in center region 21. For another, sinter elements 22c represent substitute interconnections between each other. In other words, a malfunction of the sinter connection of an individual sinter element 22c in edge region 21c no longer leads to the electrical, thermal or mechanical overloading of chip 13, since the multitude of the remaining functional sinter elements 22c is able to compensate for this malfunction. This makes it possible to ensure the functioning of entire sinter layer 12.

It may be the case that sinter elements 22b, which have a lateral extension that ranges between that of sinter elements 22a in center region 21a and that of sinter elements 22c in edge region 21c, are provided in an intermediate region 21b located between edge region 21c and center region 21a. In addition, the surface coverage density of sinter elements 22b in intermediate region 21b may lie between that in center region 21a and that in edge region 21c.

The entire number of sinter elements 22a, 22b, 22c may amount to between 6 and 300, for instance, especially between 12 and 240. However, this number is variable as a function of the lateral extension of chip 13. For example, sinter elements 22c in the edge region may lie in an angular range A measured from the center of substrate 11. Each sinter element 22c in edge region 21c, for instance, may take up an angular range Δ of less than 75°, especially less than 30°.

A through channel 23, via which process gas is able to be expelled or supplied during the sintering process of sinter elements 22a, 22b, 22c, leads to each sinter element 22a, 22b, 22c toward the edge of contact area 21. By way of example, one of the through channels to sinter element 22a in center region 21a is shown as dashed double arrow in FIG. 4.

In the exemplary embodiment shown in FIG. 5, a large-area sinter element 22a is situated in center region 21a. Sinter elements 22b and 22c in intermediate region 21b or edge region 21c may have trapezoidal, polygonal or other suitable shapes. The illustration in FIG. 5 is merely an example; any other form and size of sinter elements 22b and 22c may be suitable as well. In addition, sinter elements 22a, 22b and 22c have notches 24, which enable better access to interior regions of sinter elements 22a, 22b and 22c. By way of these notches or access channels 24, process gas is more easily supplied toward the center of sinter elements 22a, 22b and 22c, or removed from there. This makes for a uniform and more stable sintering process. Once again, at least one through channel 23 leads to each sinter element 22a, 22b and 22c, one of them, leading to sinter element 22a in center region 21a, being shown as dashed double arrow.

In addition to sinter layer 12, semiconductor components 10, 10' and 10" may be provided with further material in order to improve the thermal and/or electrical connection, such as underfill material, conductive adhesive, solder, heat-conducting pastes or similar materials.

Thus, a basic aspect of the present invention is the production of a sinter layer connection between a substrate (11) and a chip (13) that results both in an excellent electric and thermal connection between the substrate (11) and the chip (13) and also in a reduction of mechanical tensions within the chip (13). The present invention provides a method for producing a sinter layer (12), the method including the steps of applying a multitude of sinter elements (22a, 22b, 22c) of a base material that forms the sinter layer (12) in structured manner on a contact area (21) of a main surface (11a) of a substrate (11); placing a chip (13) to be joined to the substrate (11) on the sinter elements (22a, 22b, 22c); and heating and compressing the sinter elements (22a, 22b, 22c) in order to produce a structured sinter layer (12) which connects the substrate (11) and the chip (13) and extends within the contact area (21), the surface coverage density of the sinter elements (22a, 22b, 22c) on the substrate (11) in a center region (21a) of the contact area (21) being greater than the surface coverage density of the sinter elements (22a, 22b, 22c) in an edge region (21c) of the contact area (21), and at least one through channel (23), which extends laterally with respect to the main surface (11a) of the substrate (11,) being provided towards the edge of the contact area (21). A large-area sinter element (22a) may be situated in the center region (21a) of the contact area (21), and a multitude of, for example, circular sinter elements (22c) may be situated in an edge region (21c) of the contact area (21). The sinter elements (22a, 22b, 22c) may also have notches (24). The invention also relates to a corresponding device (10, 10', 10").

What is claimed is:

1. A method for producing a sinter layer, the method comprising:
   applying a multitude of sinter elements of a base material forming the sinter layer in structured manner on a contact area of a main surface of a substrate;
   placing a chip to be connected to the substrate on the sinter elements; and
   heating and compressing the sinter elements to produce a structured sinter layer which extends within the contact area and connects the substrate and the chip;
   wherein the surface coverage density of the sinter elements on the substrate in a center region of the contact area is greater than the surface coverage density of the sinter elements in an edge region of the contact area,
   wherein at least one through channel, which extends laterally to the main surface of the substrate, is provided from each sinter element toward the edge of the contact area; and
   wherein a notch is formed in at least one sinter element.

2. The method of claim 1, wherein the base material is a sinter paste, and the sinter paste consists of at least one of micro-particles and nano-particles, the sinter paste containing silver as main component.

3. The method of claim 1, wherein the number of sinter elements in the edge region of the contact area is greater than the number of sinter elements in the center region of the contact area.

4. The method of claim 1, wherein the surface coverage density of the sinter elements on the substrate in a region of the contact area between the center region and the edge region lies between the surface coverage density in the edge region and the surface coverage density in the center region of the contact area.

5. The method of claim 1, wherein the edge of the contact area in the lateral direction along the main surface of the substrate is set apart from the edges of the chip by at a predefined length.

6. A semiconductor component, comprising:
   a substrate having a main surface;
   a semiconductor chip, which is situated on the main surface of the substrate;
   a structured sinter layer, which is situated between the substrate and the semiconductor chip on a contact area of the main surface and which connects the semiconductor chip to the substrate, the sinter layer including a multitude of sinter elements, whose surface coverage density on the substrate in a center region of the contact area is greater than the surface coverage density of the sinter elements in an edge region of the contact area; and
   at least one through channel which extends laterally to the main surface of the substrate, between the substrate and the semiconductor chip, is provided from each sinter element toward the edge of the contact area,
   wherein a notch is formed in at least one sinter element.

7. The semiconductor component of claim 6, wherein the number of sinter elements in the edge region of the contact area is greater than the number of sinter elements in the center region of the contact area.

8. The semiconductor component of claim 6, wherein the surface coverage density of the sinter elements on the substrate in a region of the contact area between the center region and the edge region lies between the surface coverage density in the edge region and the surface coverage density in the center region of the contact area.

9. The semiconductor component of claim 6, wherein the semiconductor chip includes a power transistor or a power diode or a thryristor, and the substrate includes a DBC substrate, an IMS (insulated metal substrate), PCB (printed circuit board) substrate, AMB (active metal brazing) substrate, or a ceramic one-layer or multi-layer substrate.

10. The semiconductor component of claim 6, wherein the lateral extension of the sinter elements in the center region of the contact area is greater than the lateral extension of the sinter elements in the edge region of the contact area.

11. The method of claim 1, wherein a through channel is formed in at least one sinter element.

12. The method of claim 1, wherein at least one sinter element is formed as a trapezoid.

13. The method of claim 1, wherein at least one sinter element is formed as a polygon.

14. The semiconductor component of claim 6, wherein a through channel is formed in at least one sinter element.

15. The semiconductor component of claim 6, wherein at least one sinter element is formed as a trapezoid.

16. The semiconductor component of claim 6, wherein at least one sinter element is formed as a polygon.

* * * * *